United States Patent
Khan et al.

(10) Patent No.: US 8,633,083 B1
(45) Date of Patent: Jan. 21, 2014

(54) APPARATUS AND METHOD FOR A METAL OXIDE SEMICONDUCTOR FIELD EFFECT TRANSISTOR WITH SOURCE SIDE PUNCH-THROUGH PROTECTION IMPLANT

(71) Applicant: Spansion LLC, Sunnyvale, CA (US)

(72) Inventors: Imran Khan, Santa Clara, CA (US); Richard Fastow, Cupertino, CA (US); Dong-Hyuk Ju, Cupertino, CA (US)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 13/964,958

(22) Filed: Aug. 12, 2013

Related U.S. Application Data (62) Division of application No. 10/609,159, filed on Jun. 27, 2003, now Pat. No. 8,530,977.

(51) Int. Cl.
*H01L 21/336* (2006.01)
*H01L 21/337* (2006.01)

(52) U.S. Cl.
USPC ........... 438/305; 438/194; 438/217; 438/289; 438/290; 438/306

(58) Field of Classification Search
USPC ......... 438/194, 217, 289, 290, 301, 302, 305, 438/306; 257/E21.435, E21.443, E21.618, 257/E21.633
See application file for complete search history.

(56) References Cited

U.S. PATENT DOCUMENTS

| | | | |
|---|---|---|---|
| 5,218,221 A | | 6/1993 | Okumura |
| 5,427,964 A | * | 6/1995 | Kaneshiro et al. ............ 438/231 |
| 5,449,937 A | | 9/1995 | Arimura et al. |
| 5,451,807 A | | 9/1995 | Fujita |
| 5,583,067 A | | 12/1996 | Sanchez |
| 5,856,225 A | * | 1/1999 | Lee et al. ...................... 438/291 |
| 6,268,256 B1 | * | 7/2001 | Kuo ............................. 438/305 |
| 6,281,062 B1 | | 8/2001 | Sanchez |
| 8,530,977 B1 | | 9/2013 | Khan et al. |

* cited by examiner

*Primary Examiner* — Hung Vu (57) ABSTRACT

A metal oxide semiconductor field effect transistor (MOSFET) with source side punch-through protection implant. Specifically, the MOSFET comprises a semiconductor substrate, a gate stack formed above the semiconductor substrate, source and drain regions, and a protection implant. The semiconductor substrate comprises a first p-type doping concentration. The source and drain regions comprise an n-type doping concentration, and are formed on opposing sides of the gate stack in the semiconductor substrate. The protection implant comprises a second p-type doping concentration, and is formed in the semiconductor substrate under the source region and surrounds the source region in order to protect the source region from the depletion region corresponding to the drain region.

9 Claims, 8 Drawing Sheets

APPARATUS AND METHOD FOR A METAL OXIDE SEMICONDUCTOR FIELD EFFECT TRANSISTOR WITH SOURCE SIDE PUNCH-THROUGH PROTECTION IMPLANT

This application is a divisional application of the commonly owned and co-pending application with Ser. No. 10/609,159, by Khan et al., entitled "An Apparatus and Method for a Metal Oxide Semiconductor Field Effect Transistor with Source Side Punch-Through Protection Implant," filed Jun. 27, 2003, hereby incorporated by reference in its entirety.

TECHNICAL FIELD

The present invention relates to the field of semiconductor transistors. Specifically, the present invention relates to a metal oxide semiconductor field effect transistor with a source side protection implant.

BACKGROUND ART

A flash or block erase memory (flash memory), such as, Electrically Erasable Programmable Read-Only Memory (Flash EEPROM), includes an array of cells which can be independently programmed and read. The size of each cell and thereby the memory as a whole are made smaller by eliminating the independent nature of each of the cells. As such, all of the cells are erased together as a block.

Periphery transistors include metal-oxide semiconductor field effect transistors (MOSFETs) that, amongst other capabilities, control charging and discharging individual memory cells in the flash memory. The charging and discharging of the memory cells allow for the appropriate reading and writing of data to the specific memory cells in the flash memory. In one application, the periphery transistors can be high voltage transistors that are used to block high voltages (e.g., 20 volts) needed to run devices containing the flash memory.

As flash memory technology progresses, emphasis is directed to reduce the size of the memory cells in the flash memory and the periphery transistors supporting the flash memory. This is an effort to reduce the overall size of the chip.

Figure 1:
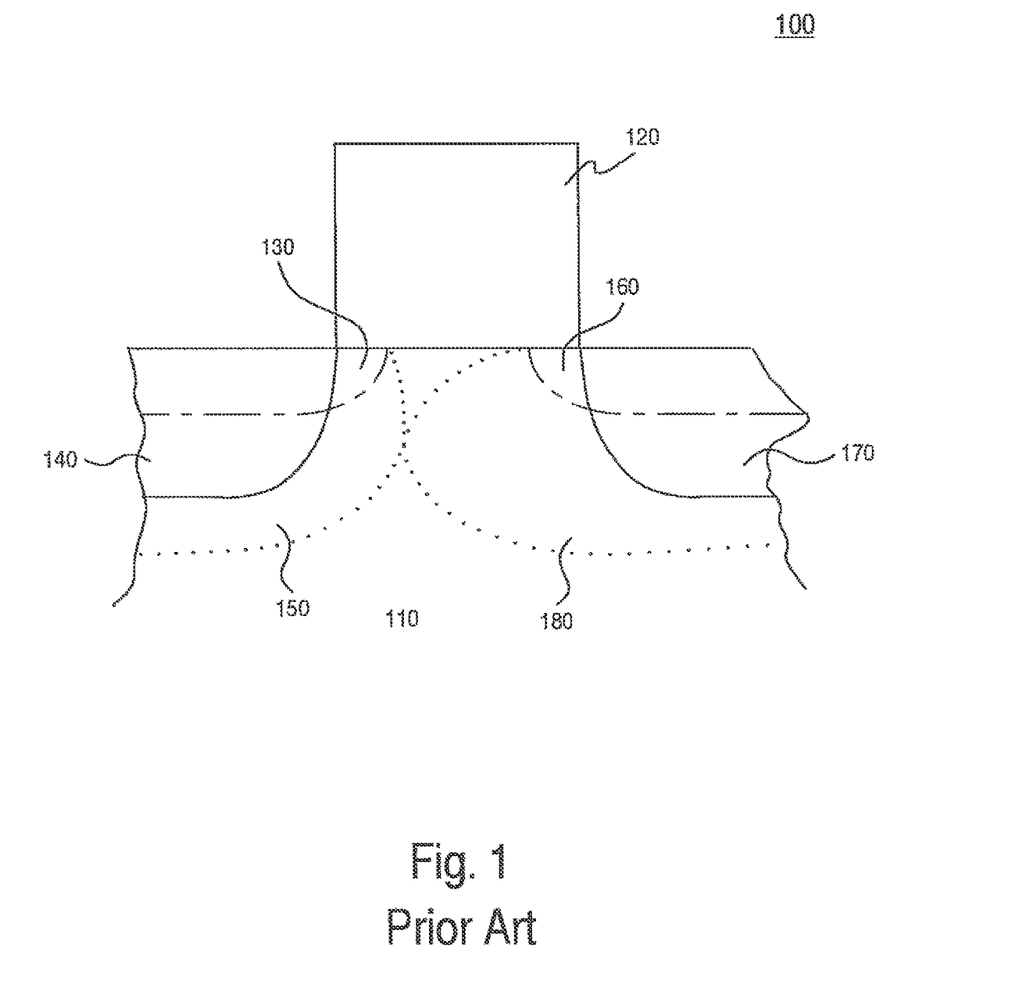
FIG. 1 is a cross sectional diagram of a metal oxide semiconductor field effect transistor (MOSFET) with a short gate length illustrating punch-through of electrons between a source region and a drain region.

Prior Art FIG. 1 is a diagram of a typical MOSFET transistor 100 that can be utilized as a periphery transistor in support of a flash memory. Prior Art FIG. 1 illustrates the negative effects of punch-through especially during application of higher voltages (e.g., 20 volts) due to reduced gate lengths. The MOSFET 100 includes a substrate 110 that includes a source region 140 and a drain region 170 that is separated by an underlying channel region under the stacked gate structure 120. The MOSFET transistor includes a lightly doped source region 130 and a lightly doped drain (LDD) region 160, both referred to as LDD regions.

However, continued reduction in size of the gate length of periphery transistors has been limited by short channel effects. Specifically, the behavior of the transistor is negatively governed by punch-through of electrons at the higher voltages. When the effective channel length between the LDD region 130 and the LDD region 160 becomes too short, the depletion region under the gate stack 120 is formed partly by the bias voltage on the drain region 170 and the built-in potential of the source region 140. As a result, the depletion region 180 due to a high bias voltage (e.g., 20 volts) on the drain region 170 can extend to the depletion region 150 surrounding the source region 140.

Correspondingly, the barrier for electron injection from the source region 140 to the drain region 170 decreases due to the extension of the depletion region 180. Specifically, at high positive drain voltages, the effective energy barrier height for electrons is reduced and electrons can migrate from the source region 140 to the drain region 170. This is known as drain induced barrier lowering (DIBL).

In the worst case, when the depletion regions 180 and 150 touch each other punch-through will occur. This will result in loss of gate control over the channel, and result in significant current flow from the source 140 to the drain 170.

Thus, even when the MOSFET 100 is turned off by biasing the stacked gate to zero volts, for high voltages (e.g., 20 volts) that are applied to the drain region 170, an unwanted current flows from the source region 140 to the drain region 170 due to punch-through. This in turn reduces the breakdown voltage of the MOSFET 100.

DISCLOSURE OF THE INVENTION

A metal oxide semiconductor field effect transistor (MOSFET) with source side punch-through protection implant. Specifically, the MOSFET comprises a semiconductor substrate, a gate stack formed above the semiconductor substrate, source and drain regions, and a protection implant. The semiconductor substrate comprises a first p-type doping concentration. The source and drain regions comprise an n-type doping concentration, and are formed on opposing sides of the gate stack in the semiconductor substrate. The protection implant comprises a second p-type doping concentration, and is formed in the semiconductor substrate under the source region and surrounds the source region in order to protect the source region from the depletion region corresponding to the drain region.

BRIEF DESCRIPTION OF THE DRAWINGS

PRIOR ART

BEST MODES FOR CARRYING OUT THE INVENTION

Reference will now be made in detail to the preferred embodiments of the present invention, a metal oxide semiconductor field effect transistor (MOSFET) with source side punch-through protection implant. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

Accordingly, the present invention discloses a MOSFET with a source side punch-through protection implant. As such, embodiments of the present invention have higher breakdown voltages than the MOSFETs of the prior art, by preventing the extension of the drain depletion region from extending to the source depletion region. In addition, embodiments of the present invention are able to fabricate MOSFETs with shorter gate lengths than MOSFETs in the prior art, by reducing short channel effects due to drain induced barrier lowering (DIBL).

Although embodiments of the present invention are described in conjunction with MOSFETs, other embodiments are well suited to the application of punch-through protection implants to various forms of transistors for the purposes of reducing punch-through of electrons from the source to drain.

Figure 2:
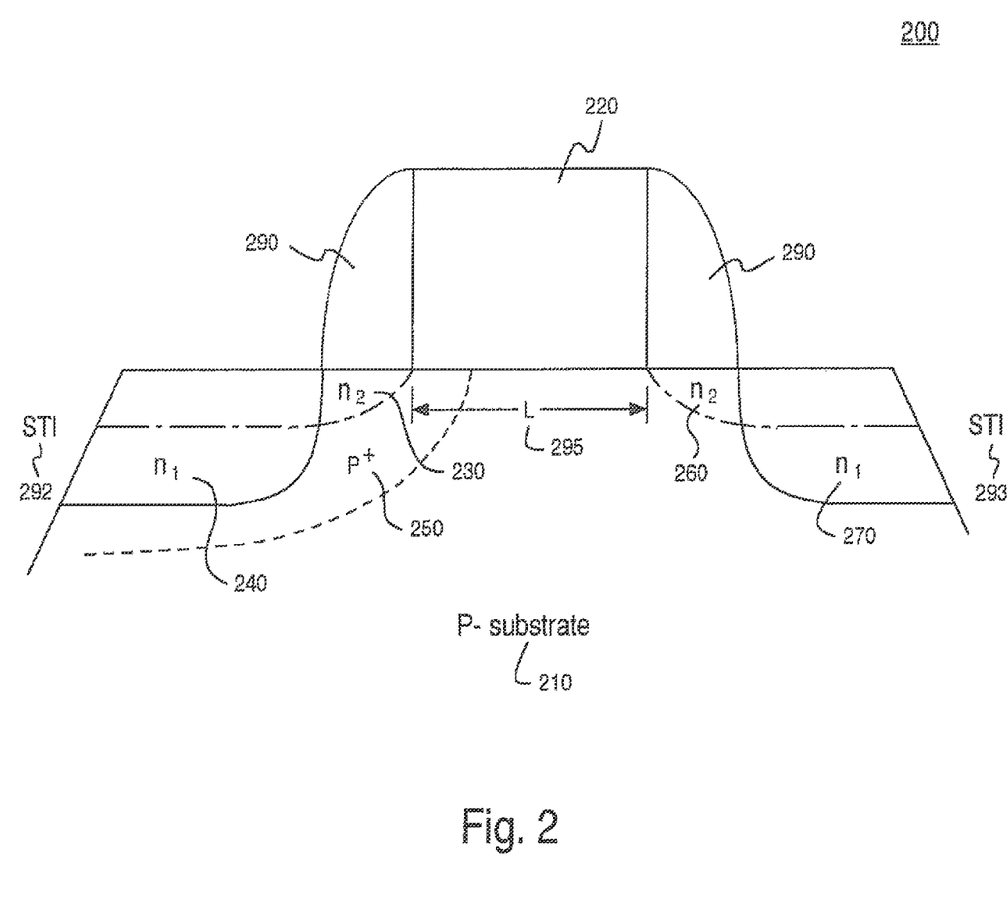
FIG. 2 is a cross sectional diagram of a MOSFET with a source side punch-through protection implant for reducing punch-through of electrons between a source region and a drain region, in accordance with one embodiment of the present invention.

FIG. 2 is a cross sectional diagram of a MOSFET 200 with source side punch-through protection implant for the reduction of punch-through of electrons, in accordance with one embodiment of the present invention. The MOSFET 200 is a small scale device having a reduced channel length L 295.

The MOSFET 200 is comprised of a semiconductor substrate 210. The substrate 210 is implanted with a first p-type doping concentration, in one embodiment, or could be epitaxially grown, in another embodiment. The MOSFET 200 includes a gate stack 220 formed above the substrate 210. The gate stack 220 is used to control conduction through the channel located between the source region 240 and the drain region 270. The source region 240 is formed to a first side of the gate stack 220 in the substrate 210. The source region 240 comprises a first n-type doping concentration (n1). The drain region 270 is formed to a second side of the gate stack 220 in the semiconductor substrate, where the second side is opposite the first side. The drain region 270 also comprises the first n-type doping concentration (n1) as present in the source region 240. In one embodiment, the drain region 270 has a greater depth than the source region 240.

Sidewall spacers 290 are used in the formation of the source region 240 and the drain region 270, in one embodiment.

Optional implantation of a second n-type doping concentration (n2) is shown adjacent to the source region 240 and the drain region 270, in accordance with one embodiment of the present invention. The doping concentration of n2 is less than the doping concentration of n1. As such, regions 230 and 260 are commonly referred to as lightly doped drain (LDD) regions.

The LDD region 230 is located in the substrate 210 adjacent to the source region 240. The LDD region 230 lies between the source region 240 and the channel located under the stacked gate 220. The LDD region 260 is located in the substrate 210 adjacent to the drain region 270. The LDD region 260 lies between the drain region 270 and the channel located under the stacked gate 220.

In one embodiment, the MOSFET 200 includes a punch-through protection implant 250. The punch-through protection implant 250 comprises a second p-type doping concentration that is greater than the first p-type doping concentration. The punch-through protection implant 250 is formed in the semiconductor substrate under the source region 240. In one embodiment, the punch-through protection implant 250 surrounds the source region 240 in the substrate 210. In another embodiment, the punch-through protection implant 250 extends below the stacked gate 220.

The punch-through protection implant 250 is formed for the purposes of reducing punch-through of electrons between the source region 240 and the drain region 270, in accordance with one embodiment of the present invention. Punch-through of electrons increases as the gate length L 295 is reduced and the bias on the drain region 270 is increased. Punch-through of electrons is reduced through the fabrication of the punch-through protection implant 250 by blocking a depletion region associated with the drain region 270 from extending to the depletion region associated with the source region 240.

Figure 3:
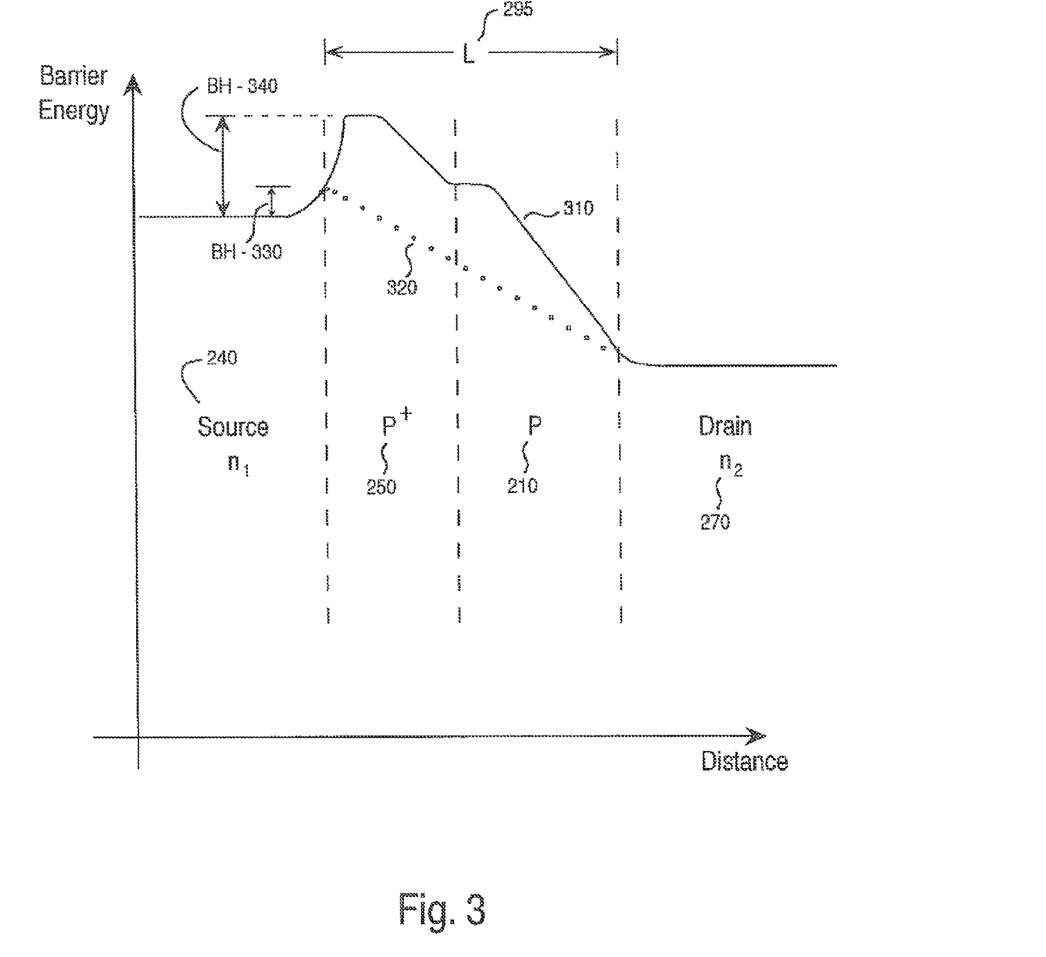
FIG. 3 is a energy band diagram illustrating the energy barrier height of the source side punch-through protection implant in a MOSFET with short gate length, in accordance with one embodiment of the preset invention.

FIG. 3 is an energy band diagram 300 illustrating the energy barrier heights of each of the components of the MOSFET 200, in accordance with one embodiment of the present invention. The energy band diagram 300 illustrates the MOSFET 200 in equilibrium when the bias on the gate stack 220 is zero volts. In the vertical axis of the energy band diagram 300, the energy associated with the barrier heights of each of the components of the MOSFET 200 necessary for an electron to overcome in order to migrate from the source region 240 to the drain region 270 is shown. Along the horizontal axis, the distance through the MOSFET 200 is plotted for an electron to conduct from the source region 240 to the drain region 270.

As the gate length L 295 is shortened, short channel effects reduce the breakdown voltage of the MOSFET 200. Assuming that the punch-through protection implant 250 is not present, dotted line 320 illustrates the reduced barrier height BH-330 that an electron must overcome through the p-type substrate in order to migrate through the channel region under the stacked gate 220. The barrier height BH-330 is much less than the barrier height of a conventional MOSFET with a longer gate length. As the gate length L 295 is shortened, the barrier height BH-330 is decreased allowing for the punch-through of electrons from the source region 240 to the drain region 270, especially for high bias voltages (e.g., 20 volts) applied to the drain region 270.

However, the present embodiment provides for an additional energy barrier for an electron to overcome when migrating from the source region 240 to the drain region 270. Curved line 310 illustrates the energy barrier that an electron must overcome to migrate from the source region 240 to the drain region 270. As illustrated in FIG. 3, an electron must overcome the energy barrier height of the punch-through protection implant 250 BH-340 to conduct through the MOSFET 200. The barrier height BH-340 is larger than the barrier height BH-330 of a MOSFET without a punch-through protection implant 250.

As a result, electrons in the source region 240 must overcome the additional and greater barrier height BH-340 of the punch-through protection implant 250 in order to migrate from the source region 240 to the drain region 270. The additional barrier height B-340 provides a buffer that repels the depletion region associated with the drain region 270 that is formed when a high voltage (e.g., 20 volts) is applied to the drain region 270. In this way, the depletion region associated with the drain region 270 is not coupled with the depletion region associated with the source region 240 as the gate length L 295 is shortened, and as higher bias voltages are applied to the drain region 270.

Thus, punch-through of electrons from the source region 240 to the drain region 270 is reduced because electrons are unable to overcome the barrier height BH-340 at equilibrium when the bias on the gate stack 220 is zero. As a result, at equilibrium (zero volts bias on the gate stack 220) no current will flow in the channel region between the source region 240 and the drain region 270 even with the shortened gate length L 295. In turn, the breakdown voltage of the MOSFET 200 is increased from a MOSFET without the punch-through protection implant 250. Furthermore, the short channel effects due to the shortening of the gate length L 295 can be overcome, such that, the characteristics (e.g., breakdown voltage, threshold voltage, etc.) of the MOSFET 200 can be maintained even as the gate length L 295 is shortened.

Although embodiments of the present invention are discussed within the context of an n-channel MOSFET device, other embodiments of the present invention are well suited to the formation of punch-through protection implants in p-channel MOSFET devices. The operation of the p-channel MOSFET is similar to that of the n-channel device, except for a reversal of the current and voltage polarities.

Figure 4:
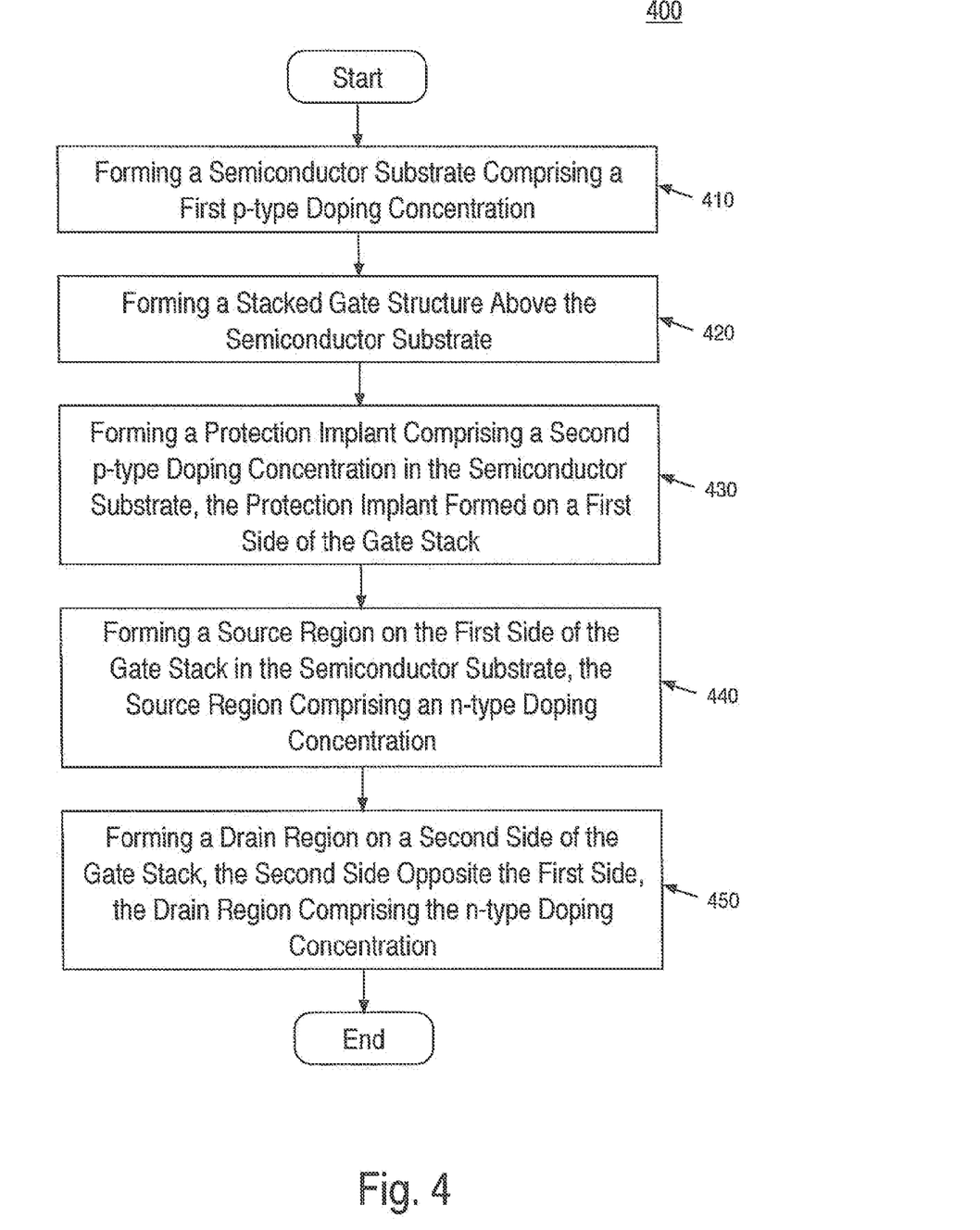
FIG. 4 is a flow chart illustrating steps in a method for the formation of a MOSFET with a source side punch-through protection implant, in accordance with one embodiment of the present invention.

FIG. 4 is a flow chart 400 illustrating steps in a method for the fabrication of a MOSFET comprising a punch-through protection implant that is capable of reducing the punch-through of electrons from the source region to the drain region as the gate length of the MOSFET is shortened, in accordance with one embodiment of the present invention. For illustration purposes only, the flow chart 400 is well suited to the fabrication of the MOSFET 200, in one embodiment.

The present embodiment begins by forming a semiconductor substrate, in step 410. The semiconductor substrate comprises a first p-type doping concentration in an n-channel enhancement mode device.

At step 420, the present embodiment forms the stacked gate structure above the semiconductor substrate. In a typical MOSFET configuration, the gate stack is comprised of a thin oxide layer sandwiched between the semiconductor substrate and a metal (e.g., aluminum), in one embodiment. The oxide layer acts as an insulator which causes the gate current to be negligibly small resulting in a high input resistance under normal operating conditions.

At step 430, the present embodiment forms the punch-through protection implant in the semiconductor substrate. The protection implant comprises a second p-type doping concentration. In one embodiment, the second p-type doping concentration is greater than the first p-type doping concentration of the semiconductor substrate in order to increase the energy barrier height needed for an electron to migrate from a source region to a drain region of the MOSFET. In this way, the depletion region associated with the drain region does not extend to the depletion region associated with the source region even as the gate length of the MOSFET is shortened.

The protection implant is formed on a first side of the gate stack. The protection implant is formed on the same side of the source region. In one embodiment, the protection implant is formed before the formation of the source region. The protection implant is of a depth that is greater than the depth of the source region. In this manner, the protection implant surrounds the source region in the semiconductor substrate.

At step 440, the present embodiment forms the source region in the semiconductor substrate. As previously described, the source region is formed on the first side of the gate stack. The source region is comprised of an n-type doping concentration.

At step 450, the present embodiment forms the drain region in the semiconductor substrate. The drain region is formed on a second side of the gate stack, where the second side is opposite the first side. The drain region also comprises the n-type doping concentration found in the source region. In one embodiment, the source region and the drain region are formed simultaneously. In another embodiment, the n-type doping concentration of the drain region is different from the n-type doping concentration for the source region. In this case, formation of the drain region occurs independently of the source region.

Figure 5:
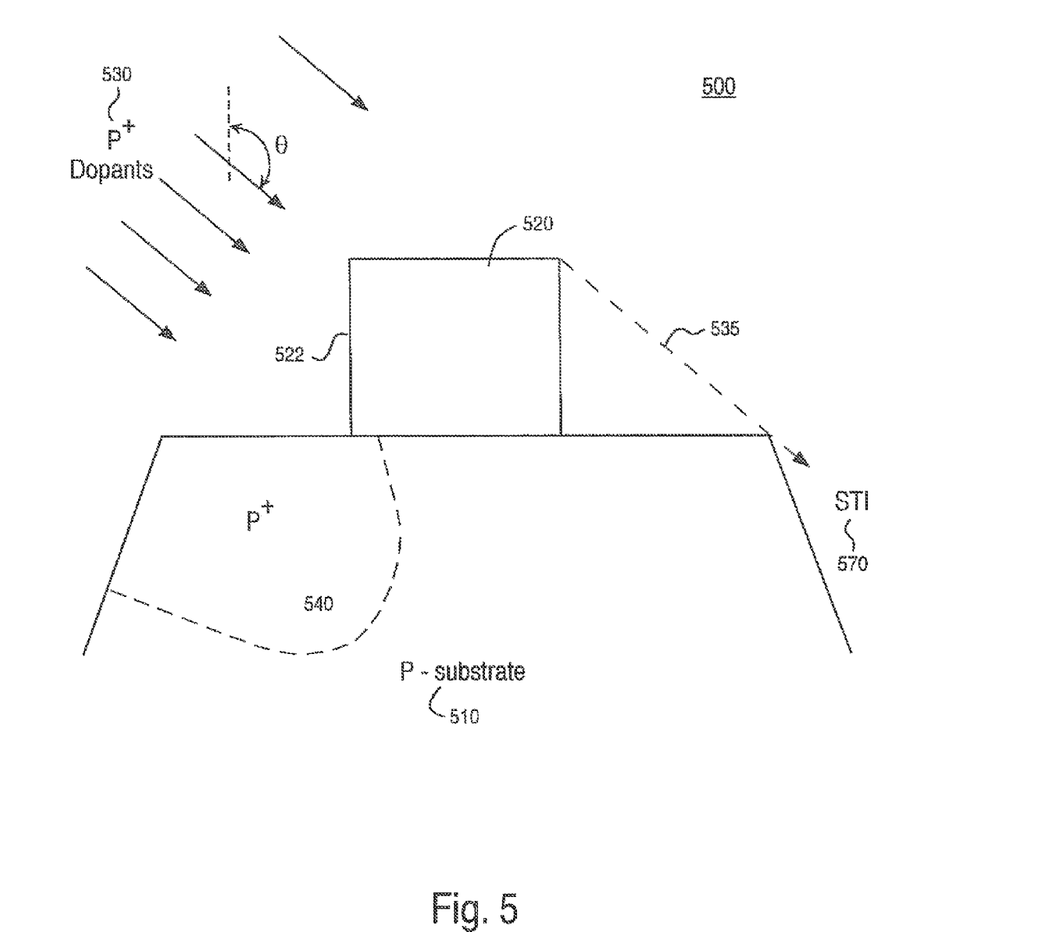
FIG. 5 is a cross sectional diagram of a MOSFET illustrating the implantation of p+ dopants at an incident angle for self aligned source sided implantation, in accordance with one embodiment of the present invention.

FIG. 5 is a diagram illustrating the formation of the punch-through protection implant during fabrication of a MOSFET 500, in accordance with one embodiment of the present invention. The present embodiment utilizes a shadow effect of the gate stack 520 to perform a self aligned implantation process.

Because the gate stack 520 acts as a mask, the implantation of p+ dopants 530 is isolated to the side 522 of the gate stack 520 where the source region will be formed. This is accomplished by injecting the p+ dopants 530 at an incident angle theta (θ) during implantation.

As such, the gate stack 520 prevents the implantation of p+ dopants 530 into the semiconductor substrate 510 in the region where the drain region will be formed. Line 535 illustrates the plane through which p+ dopants are shadowed by the gate stack 520. Line 535 extends from the top of the gate stack 520 to the edge of the MOSFET where the shallow trench isolation region (STI) 570 is formed on the drain side.

On the other hand, the gate stack 520 provides for a self aligned process that implants the p+ dopants 530 in the semiconductor substrate on the side where the source region will later be formed. In this way, multiple masking and mask removal steps can be avoided in the formation of the MOSFET with punch-through protection implant. Efficiency and yield is increased by eliminating the masking and mask removal steps from the fabrication process.

Because of the tilt angle of the implantation of the p+ dopants, and the process thermal cycle, the protection implant 540 extends laterally to a part of the semiconductor substrate that is slightly below the gate stack 520, in one embodiment of the present invention. The lateral extension under the gate stack 520 can be reduced by implanting the punch-through protection implant through masking techniques as will be described more fully below.

Figure 6A:
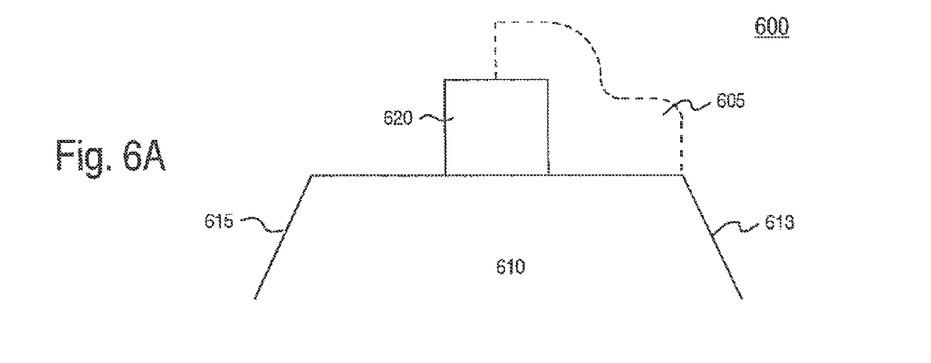
FIG. 6A is a diagram illustrating the fabrication of a MOSFET with a source side punch-through protection implant, where a mask formation protects a drain region from implantation of p+ dopants, in accordance with one embodiment of the present invention.
Figure 6B:
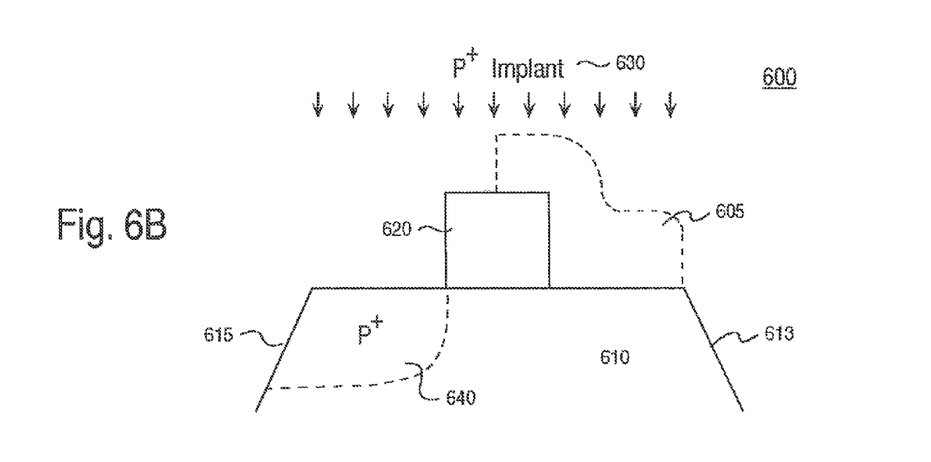
FIG. 6B is a diagram illustrating the fabrication of a MOSFET with a source side punch-through protection implant, where p+ dopants are implanted into a source region of the MOSFET, in accordance with one embodiment of the present invention.
Figure 6C:
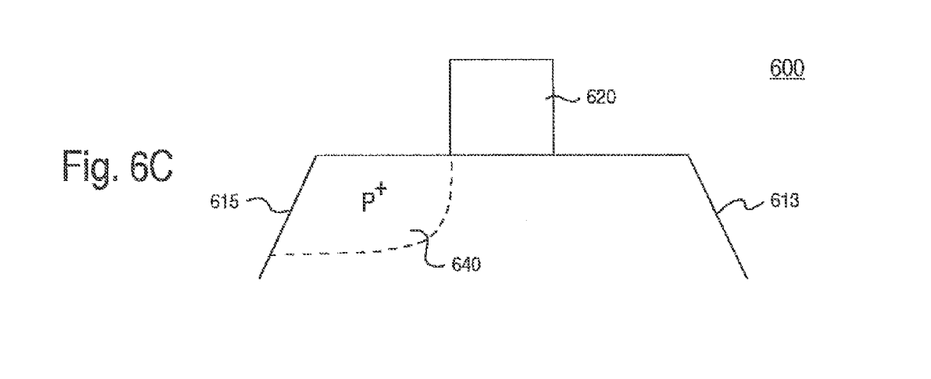
FIG. 6C is a diagram illustrating the fabrication of a MOSFET with a source side punch-through protection implant, where a source side punch-through protection implant is fabricated with the removal of the mask, in accordance with one embodiment of the present invention.
Figure 7:
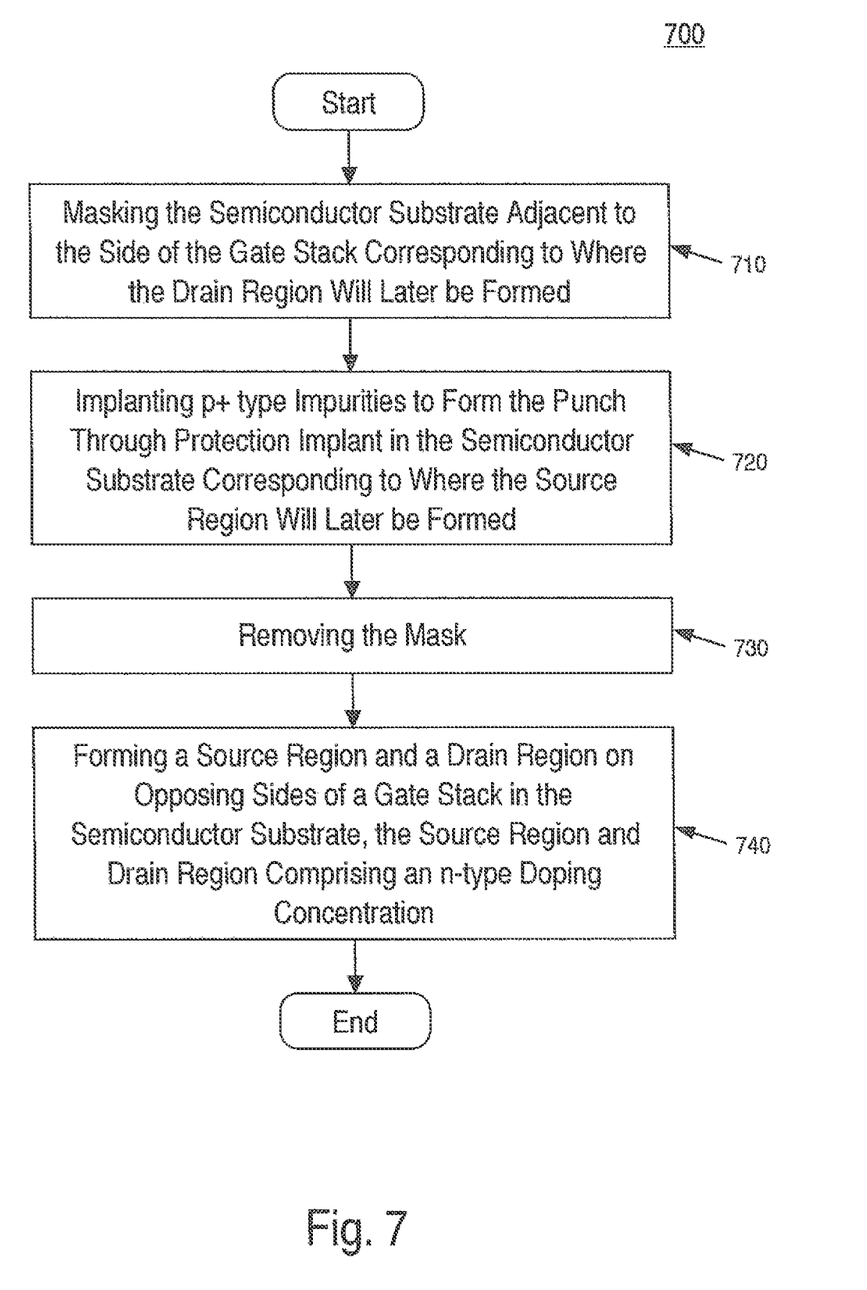
FIG. 7 is a flow chart illustrating steps in a method for the formation of a source side punch-through protection implant using masking techniques during the fabrication of a MOSFET, in accordance with one embodiment of the present invention.

The flow chart 700 of FIG. 7 illustrates steps in a method for using masking techniques to form a punch-through protection implant during fabrication of a MOSFET, in accordance with one embodiment of the present invention. FIGS. 6A, 6B, and 6C disclose the masking techniques used in the flow chart 700 for directing the punch-through protection implant to the side of the MOSFET where the source region will be formed, in one embodiment.

At step 710, the embodiment associated with FIG. 7 masks the side of the semiconductor substrate on the side of the gate stack corresponding to the drain region of a MOSFET device. Any masking technique known to those skilled in the art can be used for masking the semiconductor substrate in step 710.

By way of illustration only, FIG. 6A shows a cross-sectional diagram of the formation of a mask 605 over a semiconductor substrate 610 as disclosed previously in step 710, in one embodiment. FIG. 6A illustrates the fabrication steps for the formation of a punch-through protection implant during fabrication of a MOSFET 600. The mask 605 is concentrated to the side of the gate stack 620 that corresponds to the drain region of the MOSFET that will be formed later. Also, walls 613 and 615 define the boundary between the MOSFET 600 and STI regions. The STI regions isolate the MOSFET 600 from other devices.

At step 720, the embodiment associated with FIG. 7 implants impurities to form the punch-through protection implant. As described previously, for an n-channel MOSFET, the impurities will be of a p+ type with a doping concentration that is greater than the p-type semiconductor substrate. Because of the mask formed in step 710, the implantation of the punch-through protection implant is concentrated on the side of the gate stack corresponding to the source region of the MOSFET.

By way of illustration only, FIG. 6B shows a cross sectional diagram of the implantation of p+ impurities 630 during the fabrication of the MOSFET 600, in accordance with one embodiment of the present invention. As shown in FIG. 6B, the mask 605 prevents the implantation of the p+ impurities in the semiconductor substrate corresponding to the side of the gate stack 620 adjacent to which the drain region of the MOSFET 600 will later be formed. As such, the p+ impurities 630 are implanted into the semiconductor substrate to form a punch-through protection implant 640. The punch-through protection implant 640 is formed on the side of the gate stack associated with the source region of the MOSFET 600. The source region will be formed later during the fabrication of the MOSFET. This is because the thermal cycle implant 630 extends laterally to fully encapsulate the source region.

At step 730, the embodiment associated with the flow chart 700 of FIG. 7 removes the mask protecting the semiconductor substrate corresponding to the drain region during fabrication of the MOSFET. Any mask removal technique known in the art is suitable for removal of the mask formed in step 710.

By way of illustration only, FIG. 6C shows a cross sectional diagram of the removal of the mask 605 during fabrication of the MOSFET 600, in accordance with one embodiment of the present invention. The resulting device comprises a gate stack 620 located above a semiconductor substrate 610, and a punch-through protection implant 640. The punch-through protection implant 640 is isolated to the side of the gate stack 620 in the semiconductor substrate 610 where the source region of the MSOFET 600 will later be formed.

At step 740, the embodiment associated with the flow chart 700 completes the fabrication of the MOSFET device by forming a source region and a drain region on opposing sides of the gate stack. The source region and the drain region are formed in the semiconductor substrate. In one embodiment the source region and the drain region comprise similar n-type doping concentrations in an n-channel MOSFET. In another embodiment, the source region and the drain region comprise different n-type doping concentrations, as previously discussed.

Figure 8:
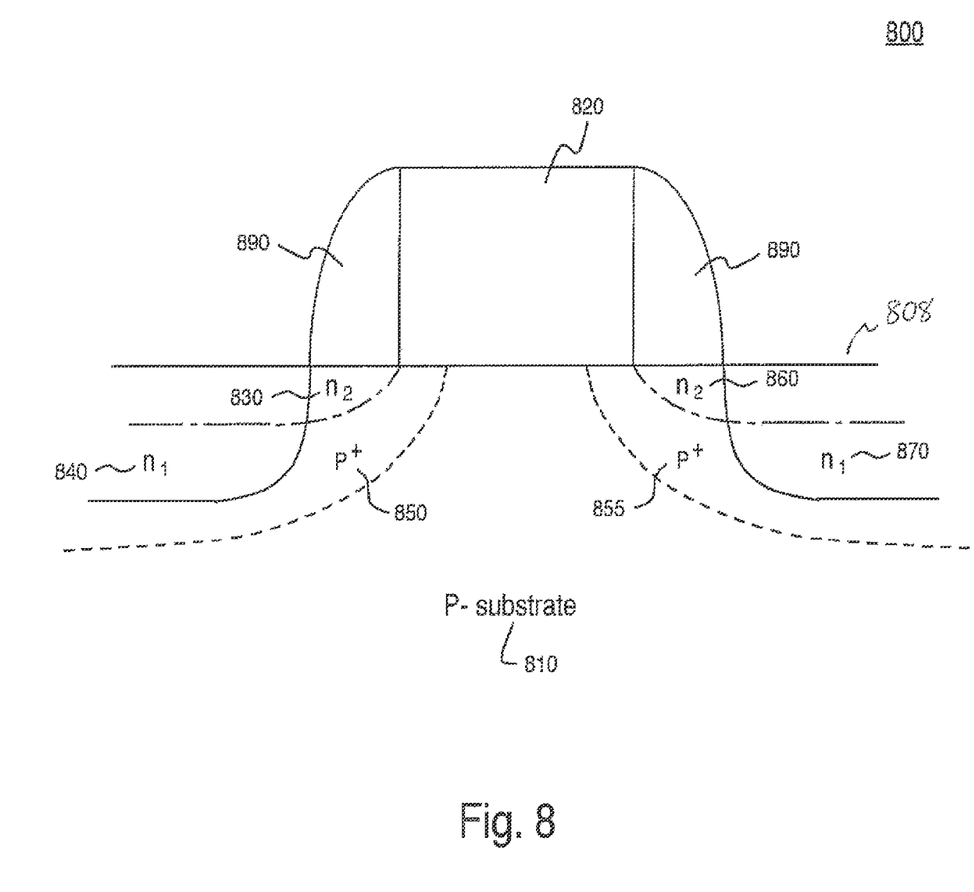
FIG. 8 is a cross sectional diagram of a MOSFET with source side and drain side punch-through protection implants for reducing punch-through of electrons between a source region and a drain region, in accordance with one embodiment of the present invention.

FIG. 8 is a cross sectional diagram of a MOSFET 800 with punch-through protection implants located on either side of a gate stack for the reduction of punch-through of electrons due to shorter channel lengths, in accordance with one embodiment of the present invention. The MOSFET 800 is a small scale device having a reduced channel length.

The MOSFET 800 is comprised of a semiconductor substrate 810. The substrate 810 is implanted with first p-type doping concentration in an n-channel device. The MOSFET 800 includes a gate stack 820 formed above the substrate 810. The gate stack 820 is used to control conduction through the channel located between region 840 and the region 870.

Region 840 is formed to a first side of the gate stack 820 in the substrate 810. The source region 840 comprises a first n-type (n1) doping concentration. Region 870 is formed to a second side of the gate stack 820 in the semiconductor substrate, where the second side is opposite the first side. Region 870 also comprises the first n-type doping concentration (n1) as present in region 840. Because the MOSFET 800 is a symmetrical device, regions 840 and 870 can be designated as a source region or a drain region.

Optional implantation of a second n-type doping concentration (n2) is shown adjacent to region 840 and region 870, in accordance with one embodiment of the present invention. The doping concentration of n2 is less than the doping concentration of n1. As such, regions 830 and 860 are commonly referred to as LDD regions. Sidewall spacers 890 are used in the formation of the region 840 and region 870.

In one embodiment, the MOSFET 800 includes punch-through protection implants 850 and 855. The punch-through protection implants 850 and 855 comprise a second p-type doping concentration that is greater than the first p-type doping concentration as found in the substrate 810. The punch-through protection implants 850 and 855 are formed in the semiconductor substrate under region 840 and region 870 for symmetry purposes. The punch-through protection implant 850 surrounds region 840 in the substrate 810. Correspondingly, the punch-through protection implant 855 surrounds region 870 in the substrate 810. The punch-through protection implants 850 and 855 are formed for the purposes of reducing punch-through of electrons between the source region 840 and the drain region 870, as previously discussed in full.

The punch-through protect implant 850 and 855 are fabricated using the methods illustrated in FIGS. 4 and 7, as previously discussed in full, in accordance with one embodiment. As such, the gate stack 820 can be used as a mask for self aligned implantation of p+ impurities to form both the punch-through protection implants 850 and 855. Fabrication of the two protection implants 850 and 855 occur at different times using different incident angles. In this case, the protection implants 850 and 855 may extend laterally underneath the gate stack 820 because of the incident angle of p+ impurities during implantation.

Also, the punch-through protection implants 850 and 855 are fabricated simultaneously, in accordance with one embodiment of the present invention. In this case, the implantation of the p+ impurities occurs perpendicular to the plane of the surface 808 of the semiconductor substrate. That is, the incident angle theta is ninety degrees to the surface 808 of the MOSFET 800. Masking of the MOSFET 800 is not necessary since the punch-through protection implant will be formed on both sides of the MOSFET 800, and the gate stack 820 forms a natural mask to the p+ impurities.

In another embodiment, the punch-through protection implants in the source region, or source and drain regions, in a MOSFET may cause the threshold voltage of the MOSFET to increase. As such, the on-state voltage of the MOSFET will also increase. To maintain the characteristics of the MOSFET as gate lengths are shortened, an optional threshold voltage adjust dopant is implanted under the gate stack in the MOSFET to restore the on-state voltage of the MOSFET.

While the methods of embodiments illustrated in flow charts 400 and 700 shows specific sequences and quantity of steps, the present invention is suitable to alternative embodiments. For example, not all the steps provided for in the methods are required for the present invention. Furthermore, additional steps can be added to the steps presented in the present embodiment. Likewise, the sequences of steps can be modified depending upon the application.

The preferred embodiment of the present invention, a MOSFET with source side punch-through protection implant for reducing punch-through of electrons from source to drain due to a reduction in gate length, is thus described. While the present invention has been described in particular embodiments, it should be appreciated that the present invention should not be construed as limited by such embodiments, but rather construed according to the below claims.

What is claimed is:

1. A method of fabricating a punch-through protection implant in a metal oxide semiconductor field effect transistor (MOSFET), the method comprising:
    forming a semiconductor substrate comprising a first p-type doping concentration;
    forming a gate stack above said semiconductor substrate, wherein said gate stack is configured such that said MOSFET is a small scale device having a reduced channel length for a channel region defined under said gate stack;
    forming a source region to a first side of said gate stack in said semiconductor substrate, said source region comprising a first n-type doping concentration;
    forming a first lightly doped region in said semiconductor substrate extending from said source region towards said channel region, said first lightly doped region comprising a second n-type doping concentration;
    forming a drain region to a second side of said gate stack in said semiconductor substrate, said second side opposite said first side relative to said gate stack, said drain region comprising said first n-type doping concentration;
    forming a second lightly doped region in said semiconductor substrate extending from said drain region towards said channel region, said second lightly doped region comprising said second n-type doping concentration; and
    forming a first protection implant comprising a second p-type doping concentration, said first protection implant formed in said semiconductor substrate under said source region and surrounding said source region and said first lightly doped region, and wherein said first protection implant extends under said gate stack;
    wherein said first side of said gate stack includes:
        a first region comprising said first n-type doping concentration, said second n-type doping concentration, said first p-type doping concentration, and said second p-type doping concentration,
        a second region comprising said first n-type doping concentration, said first p-type doping concentration, and said second p-type doping concentration,
        a third region outside said source region and comprising said second n-type doping concentration and said first and second p-type doping concentrations but not said first n-type doping concentration, said third region adjacent to a sidewall spacer adjacent to said gate stack,
        a fourth region outside and adjacent to said first region, said second region, and said third region, said fourth region extending under said gate stack so that a portion of said fourth region overlaps and is adjacent to said gate stack, said fourth region comprising said first and second p-type doping concentrations but not said first n-type doping concentration and not said second n-type doping concentration, and
        a fifth region comprising said substrate comprising said first p-type doping concentration but not said second p-type doping concentration and not said first n-type doping concentration and not said second n-type doping concentration;
    wherein in cross-section said fourth region is adjacent to each of said first, second and third regions and separates each of said first, second and third regions from said fifth region, and wherein said fourth region is on said first side comprising said source region but not on said second side comprising said drain region.

2. The method of claim 1, wherein said first protection implant blocks a depletion region coupled to said drain region from coupling to said source region to reduce punch-through effects between said source region and said drain region.

3. The method of claim 1, wherein said first protection implant is formed by utilizing a shadow effect of said gate stack to perform a self aligned process to isolate implantation of said protection implant to said first side of said gate stack.

4. The method of claim 1, wherein a depth of said source region and said drain region is deepened to maintain a breakdown voltage as a gate length of said MOSFET is reduced.

5. The method of claim 1, wherein said second p-type doping concentration is greater than said first p-type doping concentration.

6. The method of claim 1, wherein said MOSFET is an enhancement mode MOSFET.

7. The method of claim 1, wherein said first lightly doped region is formed in said semiconductor substrate to a lesser depth than said source region, and wherein said second lightly doped region is formed in said semiconductor substrate to a lesser depth than said drain region.

8. The method of claim 1, further comprising implanting a threshold voltage adjust dopant under said gate stack, for restoring an on-state voltage of said MOSFET by decreasing a threshold voltage of said MOSFET.

9. The method of claim 1, wherein said second n-type doping concentration is less than said first n-type doping concentration.

* * * * *